(12) United States Patent
Endo et al.

(10) Patent No.: US 9,406,350 B2
(45) Date of Patent: Aug. 2, 2016

(54) PORTABLE STORAGE DEVICE THAT CAN CHECK MEMORY FREE SPACE

(71) Applicant: KYOCERA Document Solutions Inc., Osaka (JP)

(72) Inventors: Wataru Endo, Osaka (JP); Akira Yuki, Osaka (JP); Masato Tanba, Osaka (JP); Ayaka Ikejima, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 0 days.

(21) Appl. No.: 14/872,023

(22) Filed: Sep. 30, 2015

(65) Prior Publication Data

US 2016/0093342 A1 Mar. 31, 2016

(30) Foreign Application Priority Data

Sep. 30, 2014 (JP) .................................. 2014-201613

(51) Int. Cl.
*G11C 7/00* (2006.01)
*G11C 5/14* (2006.01)

(52) U.S. Cl.
CPC . *G11C 7/00* (2013.01); *G11C 5/147* (2013.01)

(58) Field of Classification Search
CPC ................................... G11C 7/00; G11C 5/147
See application file for complete search history.

(56) References Cited

U.S. PATENT DOCUMENTS

| 6,438,086 B1* | 8/2002 | Haneda | G06F 3/0613 369/53.24 |
| 2012/0079174 A1* | 3/2012 | Nellans | G06F 12/0246 711/103 |
| 2014/0208044 A1* | 7/2014 | Kim | G11C 16/3418 711/154 |

FOREIGN PATENT DOCUMENTS

JP 2001-147783 A 5/2001

* cited by examiner

*Primary Examiner* — Khamdan Alrobaie
(74) *Attorney, Agent, or Firm* — Hawaii Patent Services; Nathaniel K. Fedde; Kenton N. Fedde

(57) ABSTRACT

A portable storage device is provided with a memory part, a free space detecting part, a vibration detecting part, a reporting part, and a controller. The memory part stores data. The free space detecting part detects a free space of the memory part. The vibration detecting part detects vibration. The reporting part reports the free space. The controller performs writing and reading of data for the memory part. If vibration is detected by the vibration detecting part, the controller causes the reporting part to report corresponding to the detection result of the free space of the memory part by the free space detecting part.

6 Claims, 4 Drawing Sheets

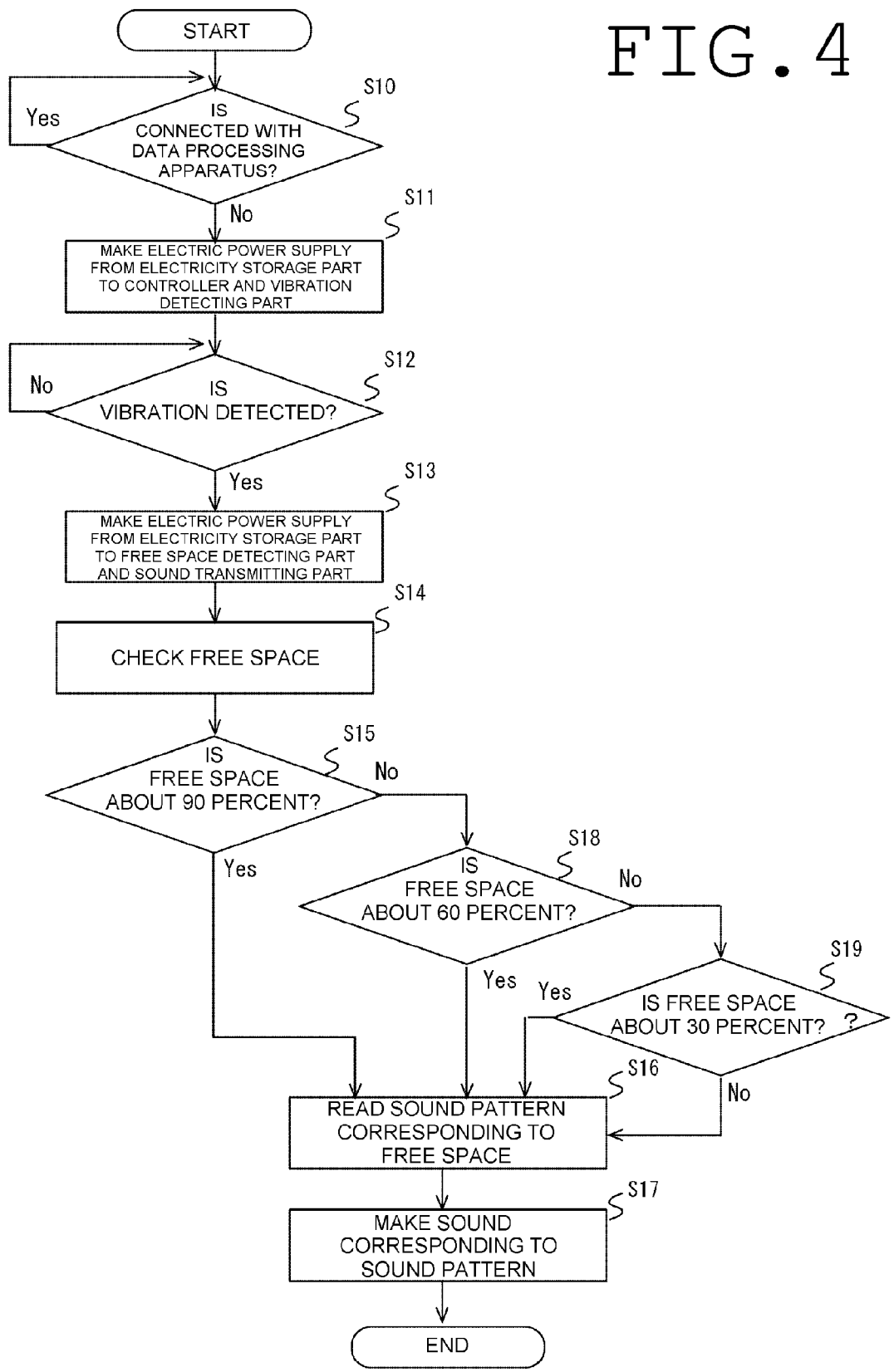

PORTABLE STORAGE DEVICE THAT CAN CHECK MEMORY FREE SPACE

INCORPORATION BY REFERENCE

This application is based on and claims the benefit of priority from Japanese Patent Application No. 2014-201613 filed on Sep. 30, 2014, the contents of that are hereby incorporated by reference.

BACKGROUND

The present disclosure is related with a portable storage device suitable for confirming a memory free space.

In a typical portable storage device represented as a USB memory, SD card, or the like, a free space decreases as storing data. Therefore, checking of a free space is required, occasionally. Checking of the free space is carried out by connecting with data processing apparatus, such as PC (personal computer). In this case, a free space is displayed on the data processing apparatus side, and it is very inconvenient.

There is an external storage of a typical case that resolves such a problem. The external small recording medium contains a micro speaker and a power supply part. A residual quantity button is arranged on a surface of the external small recording medium. Also, a buzzer sound is informed from a micro speaker as corresponded to an operation of the residual quantity button.

SUMMARY

A portable storage device according to an embodiment of the present disclosure includes: a memory part that has an area to stores data; a free space detecting part that has a circuit to detect a free space of the memory part; a vibration detecting part that has a circuit to detect vibration; a reporting part that has a circuit to inform the free space; and a controller that has a circuit that performs a writing and reading of data to the memory part; wherein the controller, when vibration is detected by the vibration detection part, causes the reporting part to inform corresponding to a detection result of the free space of the memory part by the free space detecting part.

BRIEF DESCRIPTION OF THE DRAWINGS

FIG. 4 illustrates a step of operation about reporting a free space of the USB memory shown in FIG. 1.

DETAILED DESCRIPTION

Hereinafter, an embodiment of a portable storage device of the present disclosure is explained as refer to FIG. 1-FIG. 4. As an example of a portable storage device in the following explanation, for example, it is a USB (Universal Serial Bus) memory.

Figure 1:
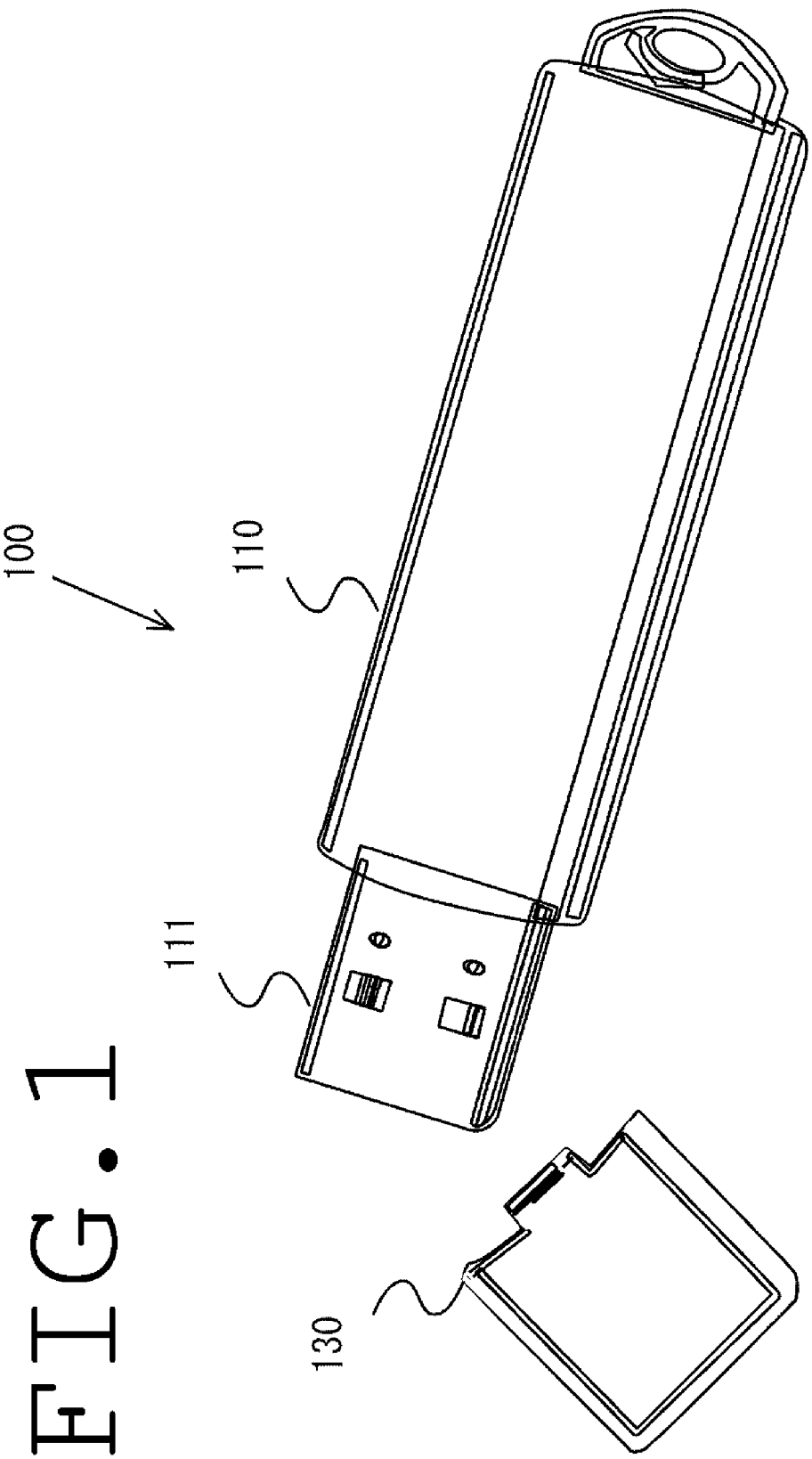
FIG. 1 illustrates an embodiment at the time of applying a portable storage device of the present disclosure to a USB memory.

Firstly, as shown in FIG. 1, USB memory 100 includes memory body 110, connecting terminal part 111, and cap 130. Connecting terminal part 111 is inserted to a USB port of after-mentioned data processing apparatus 200. Cap 130 is put on connecting terminal part 111 in order to protect connecting terminal part 111.

Figure 2:
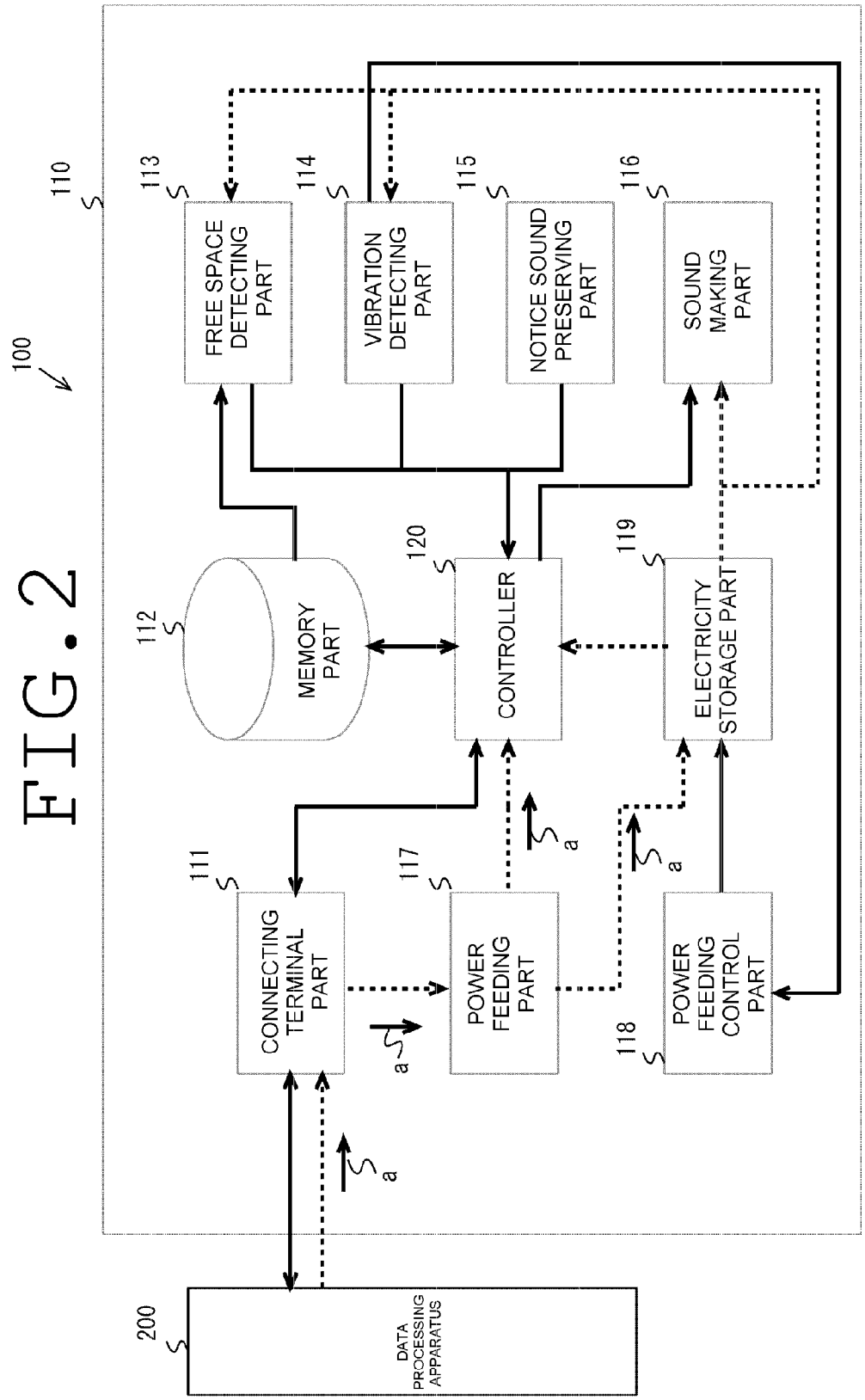
FIG. 2 illustrates a configuration in the state where a USB memory in FIG. 1 is inserted to a USB port in data processing apparatus.
Figure 3:
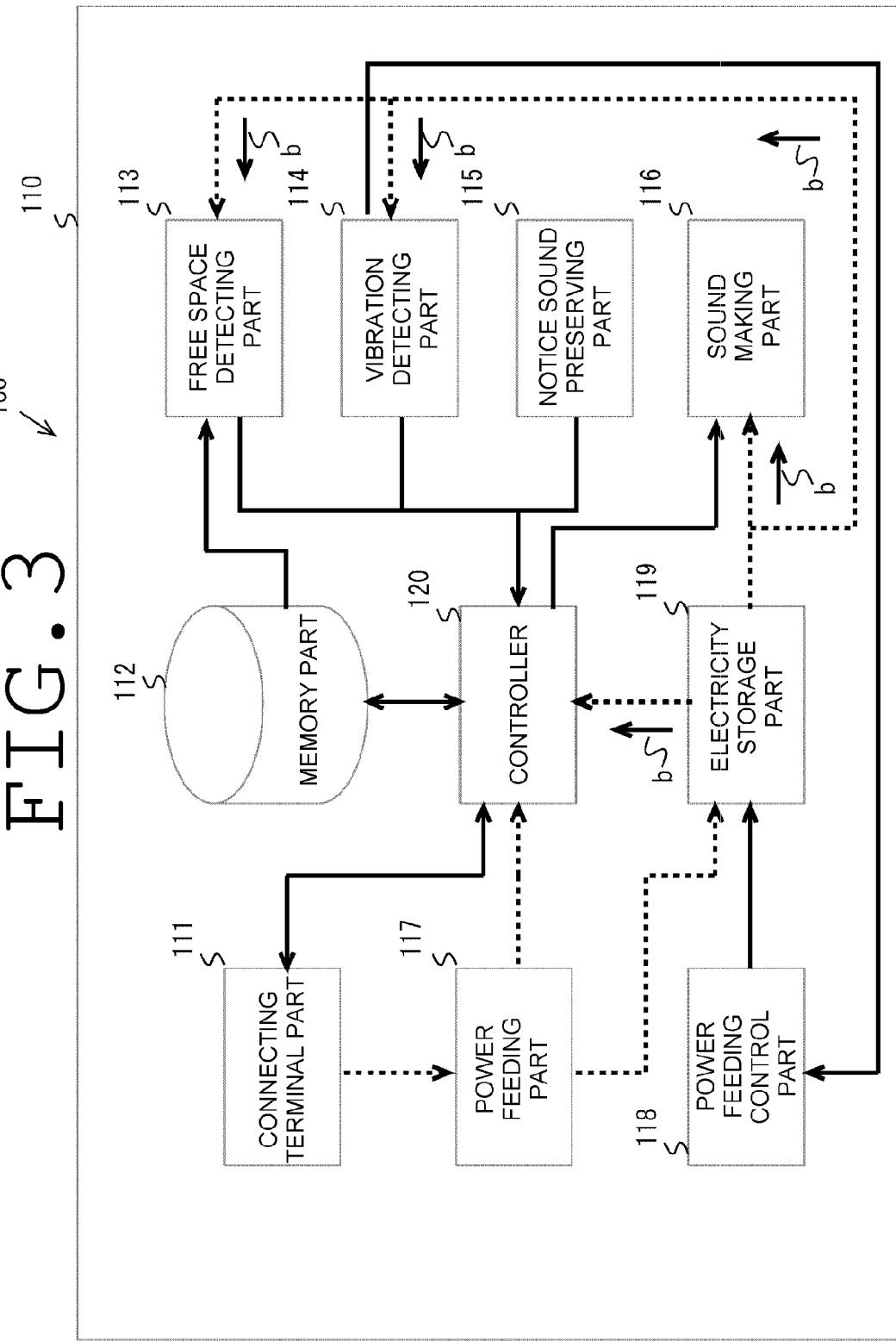
FIG. 3 illustrates a configuration in the state where the USB memory in FIG. 1 is pulled out from the USB port in data processing apparatus.

Then, a configuration of USB memory 100 is explained with reference to FIG. 2 and FIG. 3. FIG. 2 shows a case where USB memory 100 is connected with data processing apparatus 200, such as PC (Personal Computer,) via connecting terminal part 111. Also, FIG. 3 shows a case where USB memory 100 is not connected with data processing apparatus 200.

Also, in a figure explained in the following, a solid line arrow shows a flow of data, a control signal, or the like. A dotted line arrow shows a flow of electric supply. Also, solid line arrows a and b attached to a dotted line arrow shows electric supply in a case where USB memory 100 is connected with data processing apparatus 200 and in a case where USB memory 100 is not connected with data processing apparatus 200, respectively.

Firstly, as shown in FIG. 2, memory body 110 in USB memory 100, in addition to connecting terminal part 111 as mentioned above, memory part 112, free space detecting part 113, vibration detecting part 114, notice sound preserving part 115, sound making part 116, power feeding part 117, power feeding control part 118, electricity storage part 119, and controller 120 are included.

Connecting terminal part 111 is inserted in a USB port of data processing apparatus 200, such as PC (personal computer). Memory part 112 is a storage module that has an area to store various data. Free space detecting part 113 is a sensor that has a circuit to detect a free space, which indicates empty capacity, of memory part 112. When detecting the free space by free space detecting part 113, an exact free space may be detected, or an approximate free space may be detected. In addition, free space detecting part 113 in the present embodiment, for example, detects about an approximate percent unit of free space. About this, it assumes for a scene desiring to know the free space of USB memory 100. Then, it is because a case to know a needed free space accurately is not so frequent. Thus, most of the case are sufficient to be able to grasp the approximate free space.

Vibration detecting part 114 is configured with an acceleration sensor, or the like. Vibration detecting part 114 has a circuit that detects vibration of USB memory 100. That is, vibration of USB memory 100 happens because a user shakes USB memory 100. This is an action for checking a free space of USB memory 100 by a user. This action takes in an operation to shake an object in everyday life. Incidentally, it is the operation for getting to know residual quantity of the object that cannot view contents as like a spray can.

When carrying USB memory 100, for example, vibration, or the like, happens in USB memory 100. In this case, vibration detecting part 114 detects vibration at the time of carrying USB memory 100. Then, although there is no action for checking of a free space, sound is made from sound making part 116. Accordingly, vibration detecting part 114 is provided with a threshold that can certainly detect vibration in case of USB memory 100 being shaken. Shaking USB memory 100 is an action that checks a free space. This threshold is equivalent to sensitivity of vibration detecting part 114. Vibration detecting part 114 is detected as vibration when a degree of vibration is greater than or equal to the threshold. In addition, the threshold may be provided in the controller 120 side other than vibration detecting part 114 side. In this case, it becomes possible to determine presence or absence of an action for checking a free space in the controller 120 side.

Notice sound preserving part 115 is a storage module having an area where a plurality of notice sound correspond to a free space of USB memory 100 is stored as data. For example, notice sound may be a different pitch (frequency of sound), volume, a melody, or sound patterns, corresponding to a free space, respectively. Also, notice sound may be a sound to read aloud the free space. In any case, the notice sound is for just identifying the free space of memory part 112.

Here, in a case that each of the notice sound is different in a pitch, it is possible to make frequency of sound gradually higher as for a free space of USB memory 100 is, for example, about 90 percent, about 60 percent, about 30 percent, and less than 30 percent in order. Also, in a case that each of the notice sound is different in volume, it is possible to making volume gradually smaller as a free space of USB memory 100 is, for example, about 90 percent, about 60 percent, about 30 percent, and less than 30 percent in order. At this time, notice sound may have a pattern "clattering" that is emitted when putting an iron ball into a container and shaking it.

Also, in case that each notice sound is used as a different sound pattern, the sound pattern can be used as a pattern corresponding to the free space of USB memory 100. Thus, it can be a pattern that, if a free space of USB memory 100 is about 90 percent, sound is made 4 times, for example. In this case, if it is about 60 percent, sound is made 3 times. If it is 30 percent, sound is made twice. If it is less than 30 percent, sound is made once.

In addition, it is also possible to have a pattern that, if the free space of USB memory 100 is about 90 percent, sound is made once, for example. In this case, if it is about 60 percent, sound is made twice. If it is about 30 percent, sound is made 3 times. If it is less than 30 percent, sound is made 4 times.

Also, it can be a pattern that, if a free space of USB memory 100 is about 90 percent, sound is made continuously about 4 seconds, for example. In this case, if it is about 60 percent, sound is made continuously about 3 seconds. If it is about 30 percent, sound is made continuously about 2 seconds. If it is less than 30 percent, sound is made continuously about 1 second. Also, it is also possible to adopt a pattern that, if a free space of USB memory 100 is about 90 percent, sound is made continuously about 1 second, for example. In this case, if it is about 60 percent, sound is made continuously about 2 seconds. If it is about 30 percent, sound is made continuously about 3 seconds. If it is less than 30 percent, sound is made continuously about 4 seconds.

Not only the number of sounding frequency and sounding time of the notice sound, it may differ sound patterns corresponding to a free space of USB memory 100. In addition, the free space is about 90 percent means that the free space is 90 percent or more. Also, the free space is about 60 percent means that the free space is 60 percent or more to less than 90 percent. Also, the free space is about 30 percent means that the free space is 30 percent or more to less than 60 percent. Also, the free space is less than 30 percent means that the free space is less than 30 percent to no free space.

Sound making part 116 is configured of a small speaker, or the like. Sound making part 116 has a circuit that makes sound by controlling of controller 120 when vibration of USB memory 100 is detected by vibration detecting part 114.

In addition, if notice sound is not depended on the number of sounding frequency or sounding time corresponding to the free space, sound making part 116 may continue to make the notice sound while vibration detecting part 114 is detecting vibration. Thereby, the notice sound is made according to a user shaking USB memory 100. Accordingly, the free space can be recognized, sensuously.

Power feeding part 117, as shown in FIG. 2, when connecting terminal part 111 is inserted in the USB port of data processing apparatus 200, has a circuit that supplies electric power to electricity storage part 119 and controller 120 in the electric power from the data processing apparatus 200 side as shown in solid line arrow a. Power feeding control part 118, when USB memory 100 is not connected to data processing apparatus 200, has a circuit that makes electric supply to free space detecting part 113, vibration detecting part 114, sound making part 116, and controller 120 for electricity storage part 119 as shown in solid line arrow b of FIG. 3.

In addition, electric supply from electricity storage part 119 when USB memory 100 is not connected to data processing apparatus 200 may be performed only for controller 120 and vibration detecting part 114. Also, this electric supply, when vibration is detected by vibration detecting part 114, may be performed for free space detecting part 113 and sound making part 116. In this case, compared with a case where electric power is supplied all for free space detecting part 113, vibration detecting parts 114, sound making parts 116, and controllers 120, power consumption of electricity storage part 119 can be reduced.

Electricity storage part 119 is a rechargeable battery that has a member to store electricity as for electric power. Controller 120 accepts the read request from the data processing apparatus 200 side connected via connecting terminal part 111, reads the data of memory part 112, and transmits the data to the data processing apparatus 200 side. Also, controller 120 accepts the write request from the data processing apparatus 200 side connected via connecting terminal part 111 and writes the data to memory part 112.

Also, controller 120 has a circuit that, when not connecting to data processing apparatus 200 and detecting vibration of USB memory 100 by vibration detecting part 114, reads notice sound from notice sound preserving part 115 as corresponded to the detection result of the free space of memory part 112 by free space detecting part 113. Then, controller 120 has a circuit to causes sound making part 116 to make notice sound that is read.

Then, with reference to FIG. 4, operation about reporting of the free space of USB memory 100 is explained. In addition, detection of the free space of memory part 112 by free space detecting part 113 in the following explanation is carried out by the three-stage having about 90 percent, about 60 percent, and about 30 percent. Also, the notice sound stored in notice sound preserving part 115 is sound patterns. Sound patterns in this case are patterns that sound is made 4 times if the free space of USB memory 100 is about 90 percent, sound is made 3 times if it is about 60 percent, sound is made twice if it is about 30 percent, and sound is made once if it is less than 30 percent.

First, power feeding control part 118 determines whether or not connecting terminal part 111 is connected to data processing apparatus 200 (Step S10). If connecting terminal part 111 is connected to data processing apparatus 200 (Step S10: Yes), power feeding control part 118 becomes the decision waiting whether connecting terminal part 111 is connected to data processing apparatus 200. On the other hand, power feeding control part 118, if it determines that connecting terminal part 111 is not connected to data processing apparatus 200 (Step S10: No), causes electricity storage part 119 to perform the electric supply to controller 120 and vibration detecting part 114 (Step S11).

Subsequently, power feeding control part 118 and controller 120 determine whether or not vibration is detected by vibration detecting part 114 (Step S12). If vibration is not detected by vibration detecting part 114 (Step S10: No), power feeding control part 118 and controller 120 becomes the decision waiting whether or not vibration is detected by vibration detecting part 114. Here, if it determines that vibration was detected by vibration detecting part 114 (Step S10: Yes), power feeding control part 118 causes electricity storage part 119 to perform electric supply to free space detecting part 113 and sound making part 116 (Step S13).

Also, if controller 120 determines that vibration is detected by vibration detecting part 114 (Step S12: Yes), controller 120 causes free space detecting part 113 drive to detect the free space of memory part 112 and check the free space (Step S14).

Subsequently, controller 120 determines whether or not the free space is about 90 percent (Step S15). If controller 120 determines that the free space is about 90 percent (Step S15: Yes), controller 120 reads the sound pattern corresponding to the free space of USB memory 100 from notice sound preserving part 115 (Step S16). Then, controller 120 causes sound making part 116 to make sound corresponding to read sound patterns (Step S17).

Also, if controller 120 determines that a free space is not about 90 percent (Step S15: No), controller 120 determines whether or not the free space is about 60 percent (Step S18). If controller 120 determines that the free space is about 60 percent (Step S18: Yes), controller 120 reads the sound pattern corresponding to the free space of USB memory 100 from notice sound preserving part 115 (Step S16). Then, controller 120 causes sound making part 116 to make sound corresponding to read sound patterns (Step S17).

Also, if controller 120 determines that the free space is not about 60 percent (Step S18: No), controller 120 determines whether or not the free space is about 30 percent (Step S19). If controller 120 determines that the free space is about 30 percent (Step S19: Yes), controller 120 reads the sound pattern corresponding to the free space of USB memory 100 from notice sound preserving part 115 (Step S16). Then, controller 120 causes sound making part 116 to make sound corresponding to read sound patterns (Step S17).

Also, if controller 120 determines that the free space is not about 30 percent (Step S19: No), controller 120 reads the sound pattern corresponding to the free space of USB memory 100 from notice sound preserving part 115 (Step S16). Then, controller 120 causes sound making part 116 to make sound corresponding to read sound patterns (Step S17).

Thus, in the present embodiment, if vibration is detected by vibration detecting part 114, reporting to a reporting part by controlling of controller 120 is performed. This report is based on a detection result of the free space of memory part 112 by free space detecting part 113. The reporting part is notice sound preserving part 115 and sound making part 116. Thereby, by shaking USB memory 100 that is a portable storage device, the free space of memory part 112 can be checked. Accordingly, accidentally-pressing a residual quantity button is prevented. In addition, unique confirmation operation of checking the free space can be performed by shaking USB memory 100.

Also, according to the present embodiment, when connecting terminal part 111 is not connected to data processing apparatus 200, electric supply from electricity storage part 119 to vibration detecting part 114 and controller 120 by power feeding control part 118 is performed. In this case, when vibration is detected by vibration detecting part 114, electric supply to free space detecting part 113 and sound making part 116 is performed. Thereby, as compared with a case of making electric power supply all for free space detecting part 113, vibration detecting parts 114, sound making parts 116, and controller 120, power consumption of electricity storage part 119 can be reduced. Also, since the power consumption of electricity storage part 119 is reduced, stabilization of unique confirmation operation that the free space is checked by shaking USB memory 100 can be attained.

As summarized, the external storage of the typical case as mentioned above is, for example, when there is a lot of free space, a buzzer sound is informed for a long time, and when there are little free spaces, the buzzer sound is informed for a short time. Therefore, stand-alone checking of the free space for an external storage is easy.

However, in this external storage, the residual quantity button is arranged on a surface of the external small recording medium. Accordingly, a problem is predicted that the residual quantity button is pressed, accidentally, when the external storage is put on PC, or the like.

Also, checking of the free space performed by pressing a residual quantity button is based on a general action. Therefore, there is also a problem of not being unique.

As compared with this, according to the portable storage device of the present disclosure, a free space of a memory part can be checked by shaking a portable storage device. Accordingly, accidentally-pressing the residual quantity button can be prevented. In addition, unique confirmation operation that checks the free space can be performed by shaking the portable storage device.

In addition, the present embodiment is explained in the case where the portable storage device is applied to USB memory 100. However, it is not limited to this example. That is, it is applicable to other portable storage devices, such as an SD memory card.

Also, according to the present embodiment, it is explained a case where the notice sound corresponding to the free space of USB memory 100 is made from sound making part 116. However, it is not limited to this example. That is, a level meter corresponding to a free space of USB memory 100 may be displayed on memory body 110 of USB memory 100. Also, color corresponding to the free space of USB memory 100 may be displayed on memory body 110 of USB memory 100. In this case, small LED (Light Emitting Diode) that emits various kinds of colors, for example, is embedded in memory body 110 of USB memory 100. Then, it can make LED emit light corresponding to the free space of USB memory 100.

What is claimed is:

1. A portable storage device comprising:
  a memory part that has an area to store data;
  a free space detecting part that has a circuit to detect a free space of the memory part;
  a vibration detecting part that has a circuit to detect vibration;
  a reporting part that has a circuit to reports the free space; and
  a controller that has a circuit to performs writing and reading of data to the memory part; wherein
  the controller, when vibration is detected by the vibration detection part, causes the reporting part to report corresponding to a detection result of the free space of the memory part by the free space detecting part.

2. The portable storage device according to claim 1, wherein the reporting part has
  a notice sound preserving part that has an area where a plurality of notice sound corresponding to the free space is stored, and
  a sound making part that has a circuit to make the notice sound; and
  the controller,
  reads notice sound corresponding to the detection result of the free space of the memory part by the free space detecting part from the notice sound preserving part, and causes the sound making part to make sound corresponding to the notice sound.

3. The portable storage device according to claim 2, wherein the sound making part makes the notice sound having a pitch or volume corresponding to the free space.

4. The portable storage device according to claim 2, wherein the sound making part makes the notice sound while the vibration detecting part detects vibration.

5. The portable storage device according to claim 2, wherein the sound making part makes the notice sound with number of sounding frequency or sounding time corresponding to the free space.

6. The portable storage device according to claim 1, further comprising:
   a connecting terminal part connected to data processing apparatus;
   an electricity storage part that has a member to store electric power from the data processing apparatus obtained via the connecting terminal part;
   a power feeding control part that has a circuit to control electric supply from the electricity storage part; wherein
   the power feeding control part,
   when the connecting terminal part is not connected to the data processing apparatus,
   makes the electricity storage part electric supply to the vibration detecting part and the controller, and,
   when vibration is detected by the vibration detecting part, makes electric supply to the reporting part.

\* \* \* \* \*